United States Patent [19]

Nayak et al.

[11] Patent Number: 5,817,536

[45] Date of Patent: Oct. 6, 1998

[54] METHOD TO OPTIMIZE P-CHANNEL CMOS ICS USING $Q_{BD}$ AS A MONITOR OF BORON PENETRATION

[75] Inventors: Deepak Kumar Nayak, Santa Clara; Ming-Yin Hao, Sunnyvale; Rajat Rakkhit, Milpitas, all of Calif.

[73] Assignee: Advanced Micro Devices, Inc., Sunnyvale, Calif.

[21] Appl. No.: 622,479

[22] Filed: Mar. 25, 1996

[51] Int. Cl.$^6$ .......................... H01L 21/00; G01R 31/26
[52] U.S. Cl. ................................. 438/17; 438/530
[58] Field of Search .................. 438/14–18, 530

[56] References Cited

U.S. PATENT DOCUMENTS

5,023,561  6/1991  Hillard ........................... 324/719
5,598,102  1/1997  Smayling et al. ............... 324/537
5,650,336  7/1997  Eriguchi et al. .

Primary Examiner—John Niebling
Assistant Examiner—Richard A. Booth
Attorney, Agent, or Firm—Law Office of H. Donald Nelson

[57] ABSTRACT

A method to monitor boron penetration and optimize process parameters in the fabrication of a semiconductor device have an $n^+$ or a $p^-$-polysilicon gate. The charge-to-breakdown $Q_{BD}$ value is used to monitor the boron penetration into the polysilicon/gate oxide interface. Values of $Q_{BD}$ for various values of process parameters are determined and optimized values for these process parameters are derived.

6 Claims, 6 Drawing Sheets

FIG. 3A $Q_{BD} = I_G \times t_{BD}$

METHOD TO OPTIMIZE P-CHANNEL CMOS ICS USING $Q_{BD}$ AS A MONITOR OF BORON PENETRATION

BACKGROUND OF THE INVENTION

1. Field of the Invention

This invention relates generally to the manufacture of high performance semiconductor devices and, more particularly, to the manufacture of high performance sub micron semiconductor devices and, even more particularly, to a method of monitoring boron penetration in a gate electrode, optimizing process parameters and predicting the reliability of sub micron semiconductor devices.

2. Discussion of the Related Art

The semiconductor industry is increasingly characterized by a growing trend toward fabricating larger and more complex circuits on a given semiconductor chip. This is being achieved by reducing the size of individual devices within the circuits and spacing the devices closer together. The reduction of the size of individual devices and the closer spacing brings about improved electrical performance.

For example, there is increasing interest in MOS integrated circuits in which the component devices have gate dimensions as small as 0.35 μm or less. Devices having such small dimension suffer from certain problems that are not of serious concern when the gate dimensions are greater than about 1 μm. For example, the scaling rules that apply to these small devices call for very thin gate oxide layers, typically equivalent to 50–80 Å of silicon dioxide. Conventional gate oxide layers, which consist of thermally grown silicon dioxide, may be inadequate in several respects when they are made this thin. For example, such thin oxide layers tend to exhibit a high density of pinholes. These layers are also very permeable to boron. As a result, for example, boron from a p$^+$ doped polysilicon gate electrode can readily penetrate the thin oxide layer and contaminate the underlying channel during subsequent, high-temperature processing.

Early MOS integrated circuits were built using PMOS technology, primarily because enhancement-mode MOS-FETs with suitable $V_t$ values could only be fabricated as p-channel devices using aluminum or n$^+$-doped polysilicon gates and uniform lightly doped n-substrates. This is because, at that time it was not possible to produce enhancement-mode n-channel MOSFETs using n$^+$-poly or Al gates on a uniform, lightly doped p-substrate because such structures exhibit a negative threshold voltage. However, with the advent of ion implantation it became possible to build NMOSFETs with positive $V_t$s by adjusting channel doping profiles. After this, enhancement-mode and depletion-mode NMOSFETs could then be fabricated with little extra difficulty. Since n-channel transistors have greater drive current and hence speed, NMOS replaced PMOS as the dominant digital IC technology. However, when CMOS arose to become the main technology for VLSI in the late 1980s, the need for enhancement-mode p-channel MOS-FETs returned.

However, the fabrication of p-channel devices with short channels in CMOS present unique problems which arise from having to build both NMOS and PMOS devices on the same chip. The problems revolve around the choice of a doping type for the polysilicon gate electrode and the impact that this choice has on the threshold voltage and other characteristics of PMOS devices.

To achieve high drive current it is necessary to make the threshold voltage of a MOSFET as close to 0V as possible. When MOS IC technologies were initially being developed $V_t$ values with a magnitude of about 1V were acceptable. However, in n-well CMOS, as well as in twin-well CMOS, the situation changes in that in n-well CMOS the doping in the well is about 10× the doping in the substrate, making it at least $10^{16}/cm^3$. Twin-well CMOS becomes the well-architecture of choice as the gate lengths decrease below about 1 μm. For 1 μm MOS devices, both p- and n-channel, the substrate doping density must be $2-3\times10^{16}/cm^3$. Therefore, the $V_t$ values of PMOS devices made with n$^+$-poly gates in either n-well or twin-well CMOS will be at least –1.5V which is too large in magnitude. In addition, in PMOSFETs with a channel length $\leq 1$ μm, punchthrough effects are more severe than in comparably sized NMOS-FETs. This is primarily due to the inability to make p$^+$ source/drain junctions as shallow as n$^+$ junctions. To suppress such punchthrough current it is necessary to increase the n-doping in the substrate. This makes short-channel PMOS devices even more strongly enhancement mode, i.e., $V_t$ is increased even more.

For optimal logic-gate performance the threshold voltages of the n- and p-channel devices in CMOS circuits should also have comparable magnitudes. In addition, to allow for maximum current-driving capability, they should be as small as possible. For example, for 5V CMOS technologies, desirable threshold voltages are 0.6 to 0.8V for $V_{Tn}$ and –0.6 to –0.8V for $V_{TP}$.

The most common choice for the gate material has been heavily doped n-type polysilicon. For long-channel devices it has been possible to adjust both $V_{Tn}$ and $V_{TP}$ with implants of boron into the channel. However, when n$^+$ poly is the gate electrode in a PMOS device, adjustment of $V_{TP}$ to –0.7V is not simple, especially when the channel is shrunk below about 2 μm. In addition, further shrinkage of the device requires the gate oxide to be thinner which makes the use of boron to adjust $V_{TP}$ in this type of device even less feasible since larger doses of boron are needed.

An alternative is to use p$_+$ polysilicon as the gate material for PMOS devices. This appears to be mandatory when the channel length becomes smaller than 0.5 μm.

In advanced CMOS technology having channel lengths L below 0.50 μm, enhancement-mode surface-channel devices are desirable due to improved short-channel effect of these devices. The dual-poly (n$^+$-poly gate for NMOS and p$^+$-poly gate for PMOS) technology has been the trend in recent years, which produces surface-channel CMOS devices.

A major problem with p$^+$ polysilicon gates when a thin gate oxide is used is poor $V_T$ process control in the PMOS devices, due to penetration of the boron into the gate oxide and, ever worse, into the silicon substrate. It has been shown that boron will penetrate gate oxides that are $\leq 12.5$ nm thick during a 900° C. 30 minutes post-implant anneal in $N_2$. This would imply that a lower process temperature needs to be used, however, if the process temperature is too low the boron implanted into the polysilicon will not be sufficiently redistributed and the polysilicon dopant concentration at the polysilicon gate/gate-oxide interface could be less than the desired mid-$10^{19}/cm^3$ concentration level which would create $V_T$ control problems in MOS devices. This produces the poly-depletion effect.

On the other hand, if the process temperature is too high or the anneal time is for too long a time, there will be boron penetration through the gate oxide. Boron penetration through thin gate oxide from the p$^+$-polysilicon in a dual gate (also known as twin gate) CMOS technology logic device results in threshold voltage $V_T$ instability, a shift in the flat-band voltage $V_{FB}$, a degradation of channel mobility and subthreshold slope, a lower charge-to-breakdown $Q_{BD}$ value, and an increase in oxide trapping centers for p-channel devices. Because of all these effects, boron penetration into the gate-oxide has become a major reliability concern for sub-half-micron CMOS transistors due to the scaling of gate oxide.

Figure 1:
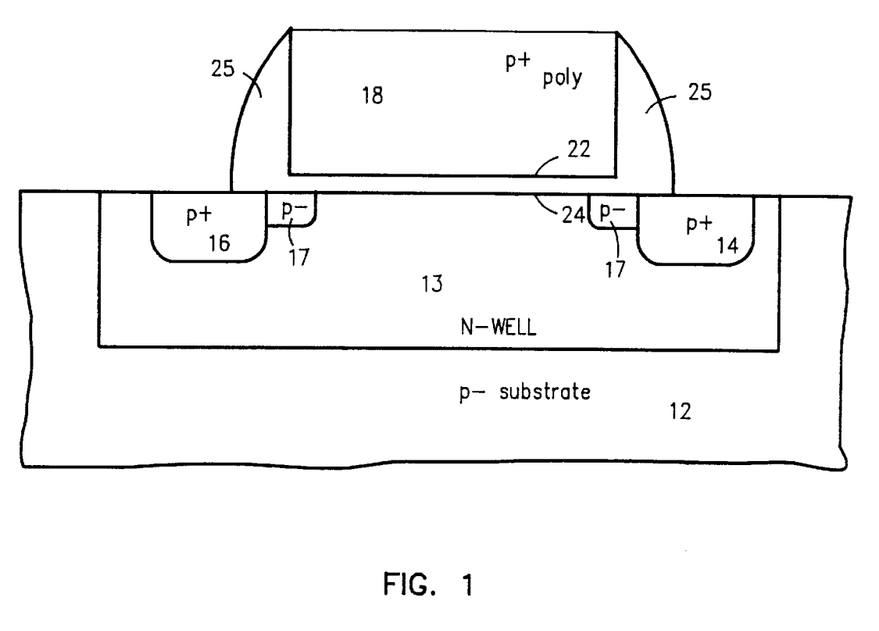
FIG. 1 shows a typical semiconductor device.

A majority of the research described in the relevant art deals with boron penetration in the channel, i.e., through the gate-oxide/Si-substrate interface. Referring to FIG. 1, there is shown a semiconductor device formed on a p⁻ silicon substrate 12 which includes an n-well 13 formed therein in which drain region 14 and source region 16 are formed. A p⁺-polysilicon gate 18 is formed on a gate-oxide layer 20 which is formed on silicon substrate 12. The p⁺-polysilicon/ gate-oxide layer form an interface indicated at 22. The gate-oxide layer 20 and Si-substrate 13 form a gate-oxide/ Si-substrate interface indicated at 24.

The boron penetration in the channel, i.e., through the gate-oxide/Si-substrate interface 24, FIG. 1, can be easily detected by the change in $V_T$ and $V_{FB}$ values. However, by the time the boron has penetrated into the channel so that $V_T$ and $V_{FB}$ values are affected the reliability of the device has been degraded beyond normally acceptable limits. This is because the gate oxide has been considerably degraded due to the boron penetration through it.

The problem that is presented to process engineers in specifying process parameters is that for the p⁺-polysilicon gate to act as a good conductor, so that drive currents are high, for example, it is necessary to have a uniform heavily doped polysilicon gate. The gate is doped by first ion implanting the dopant ions into the gate at a selected implant energy and then annealing the device at a selected temperature for a selected period of time to drive the dopant ions into the polysilicon gate. Ideally, the dopant ions would be driven with a uniform concentration profile across the polysilicon gate to the p⁺-polysilicon/gate-oxide interface 22, FIG. 1, and nothing beyond. However, the extent of the penetration of the dopant ions depends upon the process parameters, namely, the implant energy at which the ions are implanted, the anneal temperature at which the ions are driven into the gate, and the period of time at which the anneal step is conducted. If one of these parameters is incorrect, the dopant ions will be driven either too far or not far enough. If the dopant ions are driven too far the problems, as discussed above occur. If the dopant ions are not driven far enough there is an area above the p⁺-polysilicon/gate-oxide interface that has a deficiency of dopant ions. This deficiency of dopant ions exhibits an effect known as the poly-depletion effect. Poly depletion decreases the effective gate capacitance of the device and degrades device current drive.

What is needed is an accurate method to monitor and determine the extent of boron penetration at the polysilicon gate/gate oxide interface in order to determine the probable reliability of the device and to optimize the process parameters to fabricate the device.

SUMMARY OF THE INVENTION

An accurate method of monitoring and optimizing the process parameters in the fabrication of a semiconductor device having a polysilicon gate wherein the charge-to-breakdown value $Q_{BD}$ is used as an indicator of the extent to which boron penetrates the polysilicon gate. Optimization data is obtained by varying the process parameters that are to be optimized and measuring $Q_{BD}$ for each of the process parameters.

The boron ions are implanted in the polysilicon gate at various implant energies and $Q_{BD}$ measured for each energy.

Similarly, the boron ions are driven into the polysilicon gate at various anneal temperature and for various time intervals and $Q_{BD}$ measured for each temperature and time interval.

An optimum value for each parameter is selected from the measured values.

The present invention is better understood upon consideration of the detailed description below, in conjunction with the accompanying drawings. As will become readily apparent to those skilled in this art from the following description there is shown and described preferred embodiments of this invention simply by way of illustration of the mode best suited to carry out the invention. As it will be realized, the invention is capable of other different embodiment, and its several details are capable of modifications in various, obvious aspects all without departing from the scope of the invention. Accordingly, the drawings and descriptions will be regarded as illustrative in nature and not as restrictive.

BRIEF DESCRIPTION OF THE DRAWINGS

The accompanying drawings incorporated in and forming a part of the specification, illustrate the present invention, and together with the description serve to explain the principles of the invention. In the drawings.

DETAILED DESCRIPTION

Referring now to FIG. 1, there is shown a typical semiconductor device 10. Device 10 is formed on a p⁻ silicon substrate 12 and has an n-well 13 formed in silicon substrate 12. A p⁺ drain region 14 and a p⁺ source region 16 are formed in n-well 13. Also formed in n-well 13 are pLDD regions indicated at 17. A gate oxide layer 20 is formed on the surface of n-well 13. A p⁺-polysilicon gate 18 is formed on the gate oxide layer 20. The p⁺-polysilicon gate 18 and gate oxide layer 20 form an interface 22 and the gate oxide layer 20 and si-substrate form an interface at 24. Spacers 25 are formed on the sides of gate 18. It is to be understood that this invention is to comprehend a device with an n⁺-polysilicon gate, however, only the p⁻-polysilicon gate device will be described.

Figure 2:
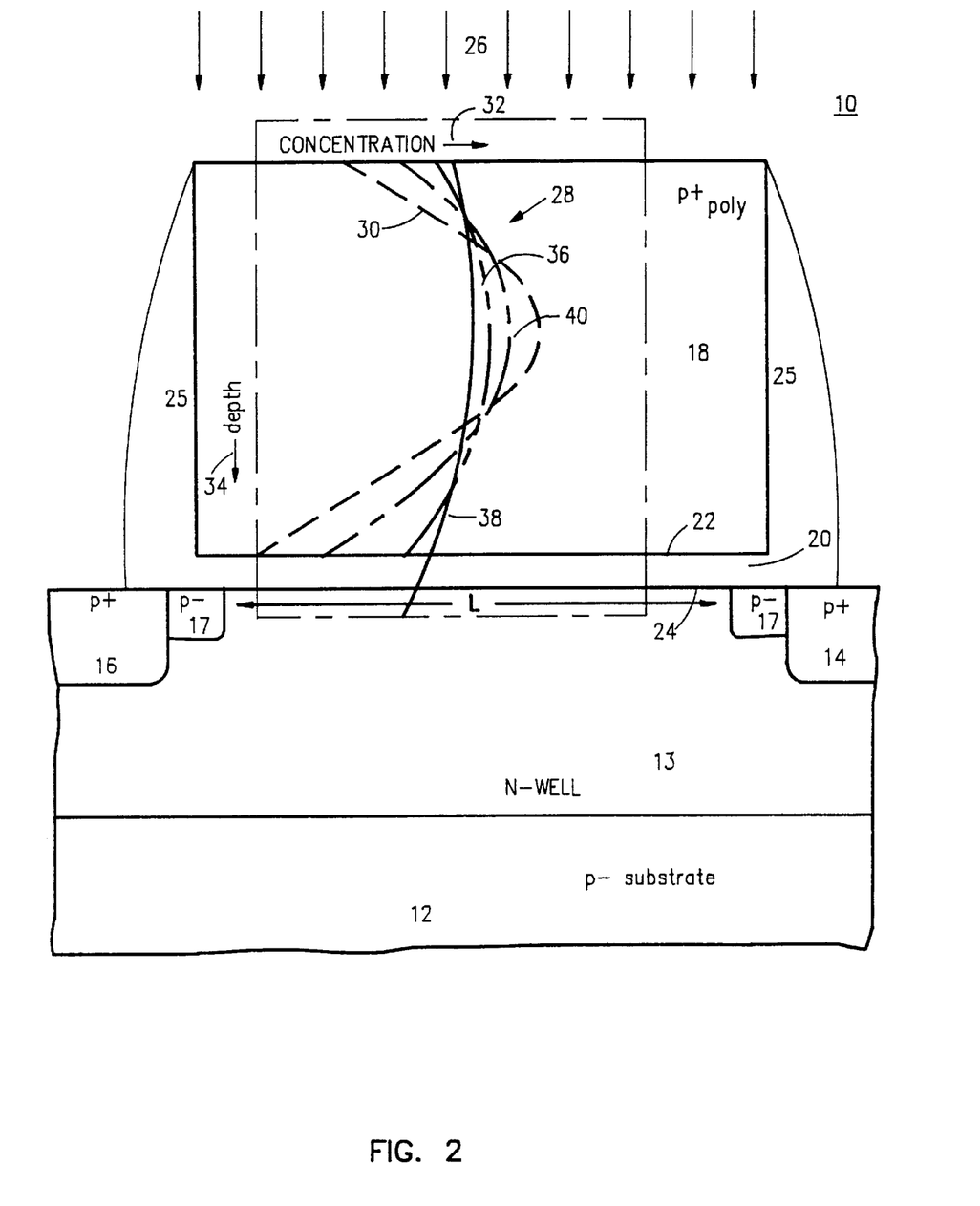
FIG. 2 shows the typical semiconductor device shown in FIG. 1 with representative concentration profiles of a dopant implanted into a p⁺-polysilicon gate.

Referring now to FIG. 2, there is shown device 10 as in FIG. 1, like features from FIG. 1 will be indicated by like numerals in FIG. 2. In the manufacture of device 10, gate oxide 20 and p+-polysilicon gate 18 are formed on Si-substrate by methods well known in the art. Part of the process is to provide polysilicon gate 18 with the proper concentration of impurities so that it will have desirable electrical characteristics to act as a good gate electrode. One of the main characteristics is for a gate to be a conductor of either electrons or holes. In this case, it is necessary to implant a dopant such as boron into the gate. This is done by the ion implantation of either B (boron) or $BF_2$ (boron fluoride) represented by arrows 26. The ion implantation is done at a selected energy level and is on the order of 30–40 KeV. Also shown in FIG. 2 are concentration profiles 28 for various different anneal parameters. Profile 30 represents the concentration profile of boron ions immediately after the ion implantation. Note that the highest concentration is at some depth within the gate 18. Also note that the direction of increasing concentration is indicated by arrow 32 and the depth into the gate is indicated by arrow 34 and, in addition, the profiles are drawn on the gate in such a way as to directly indicate the depth within the gate. Therefore, profile 30 shows the highest concentration approximately midway through gate 18.

The next step is to drive the boron ions towards interface 22. The ideal situation, as discussed above, would be for the boron ion distribution to be uniformly distributed within gate 18 up to interface 22 with no boron ions beyond. However, as can be appreciated and as indicated by profile 30 there are some ions that have been driven closer to interface 22 during the ion implantation step. In any subsequent annealing step some the closest ions will be driven to the interface and beyond. The goal of the annealing step is to achieve a uniformly heavy doped polysilicon gate up to interface 22 with as few boron ions as possible being driven into the gate oxide layer 20 and beyond. The problem facing the process engineer or designer is to select an anneal temperature and time so that the distribution profile 36 is achieved.

If the anneal temperature is too high, the ion concentration will extend beyond interface 22 and in some cases will extend beyond interface 24 as shown by profile 38.

On the other hand, if the anneal temperature is too low, the situation as shown by profile 40 could occur in which appreciable boron ion concentration does not reach interface 22. The deficiency of dopant ions at or near interface 22 will result in the poly-depletion effect.

Profile 40, for example, could represent a rapid anneal temperature of 975° C., profile 36 could represent a rapid anneal temperature of 1000° C., profile 38 could represent a rapid anneal temperature of 1025° C. These temperatures, as can be appreciated will vary depending upon the depth of gate 18 and the energy at which the ions are implanted. The above temperatures are given as typical values and as will be explained below there is disclosed a method to optimize the parameters in the processing of these devices.

Figure 3A:
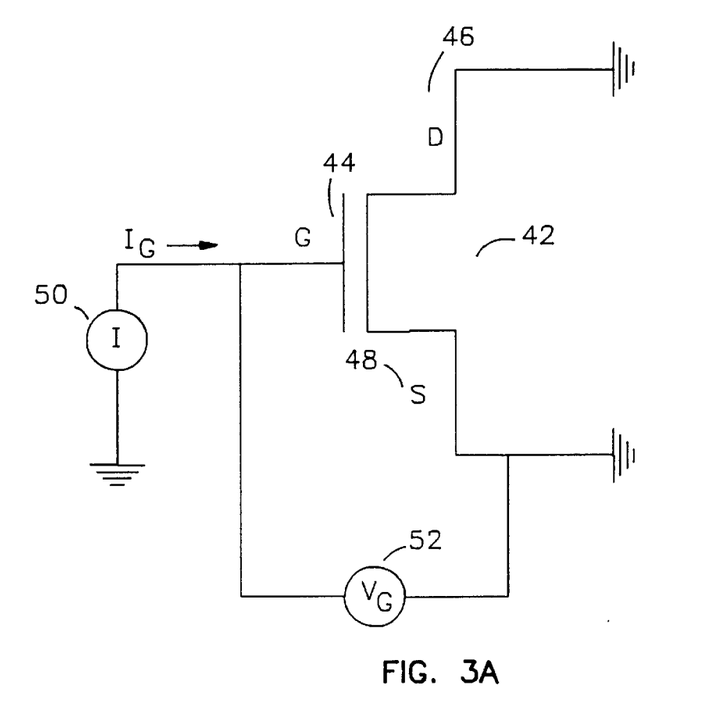
FIG. 3A shows a the measurement method for measuring $Q_{BD}$.
Figure 3B:
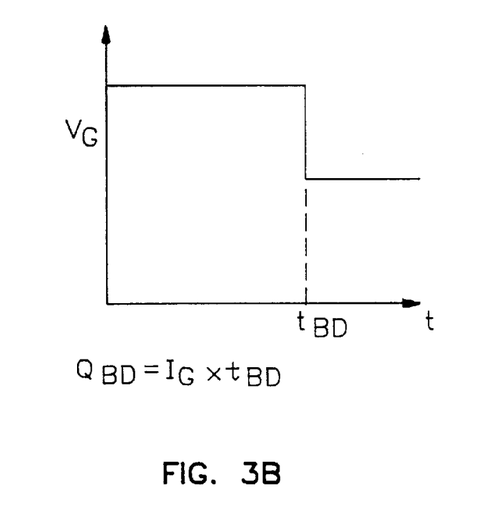
FIG. 3B is a graphical representation of the values measured by the measurement method shown in FIG. 3A.

Referring now to FIGS. 3A and 3B there is shown a measurement to measure $Q_{BD}$. FIG. 3A shows a device 42 to be measured with a gate 44, a drain 46, and a source 48. To measure $Q_{BD}$, the drain 46 and source 48 are connected to ground and a constant current source 50 is connected to gate 44. The device must be stressed in inversion. Therefore, for a device with a $p_+$-polysilicon gate the current $I_G$ should be between −20 and −200 mA/cm² and for a device with an n+-polysilicon gate the current $I^G$ should be between 2- and 200 mA/cm². The voltage at the gate is measured by voltmeter 52. FIG. 3B indicates graphically how $Q_{BD}$ is determined. $Q_{BD}=I_G \times t_{BD}$ (the gate current times the time to break-down). As indicated in FIG. 3B, the voltage at the gate $V_G$ will drop at the instant the gate oxide breaks down.

Figure 4:
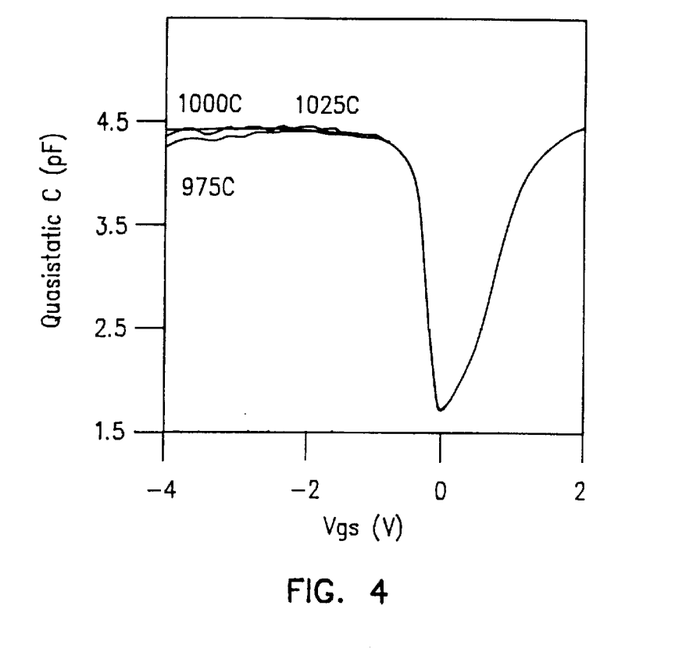
FIG. 4 is a graphical representation of the CV curves related to different values of RTA temperature.
Figure 5:
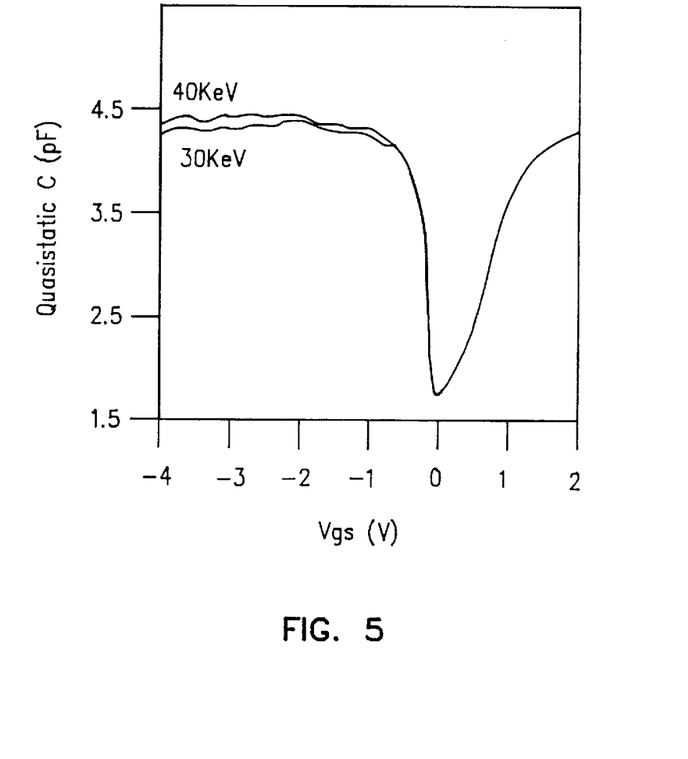
FIG. 5 is a graphical representation of the CV curves related to different values of ion implant energy.
Figure 6:
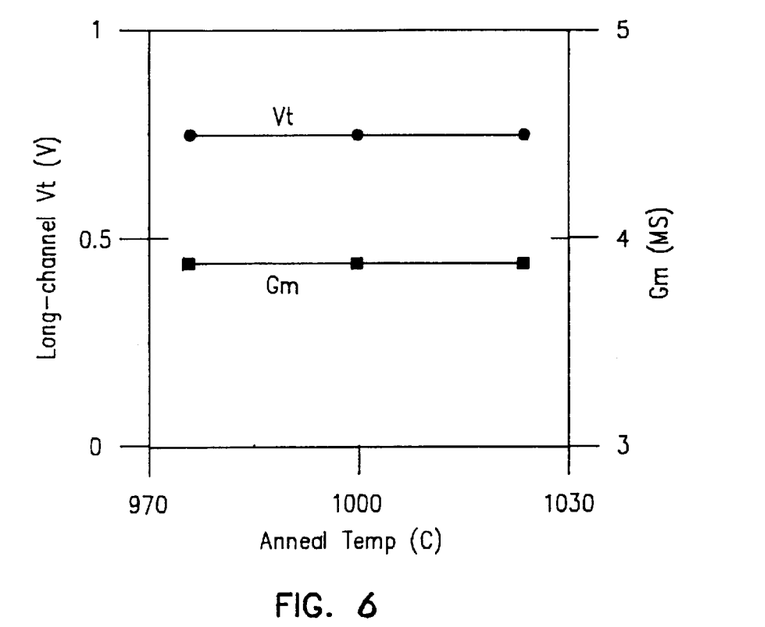
FIG. 6 is a graphical representation of the long-channel $V_T$ related to different values of anneal temperature.
Figure 7:
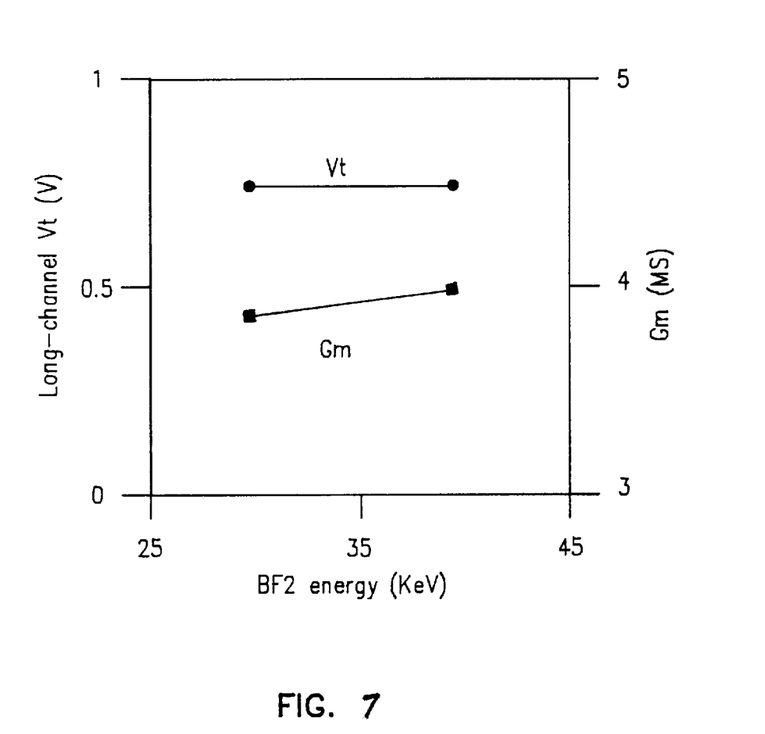
FIG. 7 is a graphical representation of the long-channel $V_T$ related to different values of ion implant energy.
Figure 8:
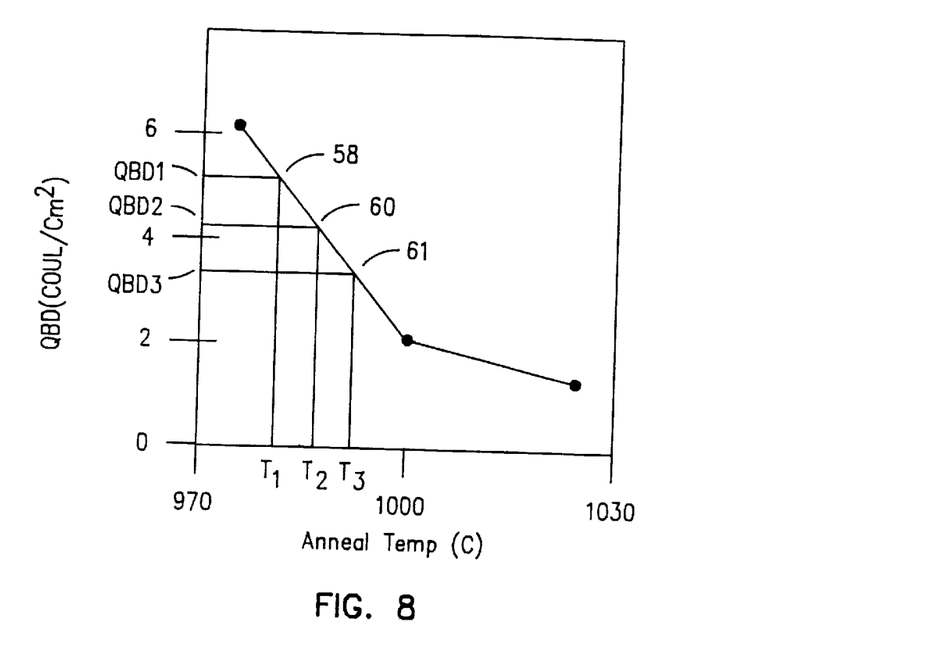
FIG. 8 is a graphical representation of the $Q_{BD}$ values related to different values of anneal temperature.
Figure 9:
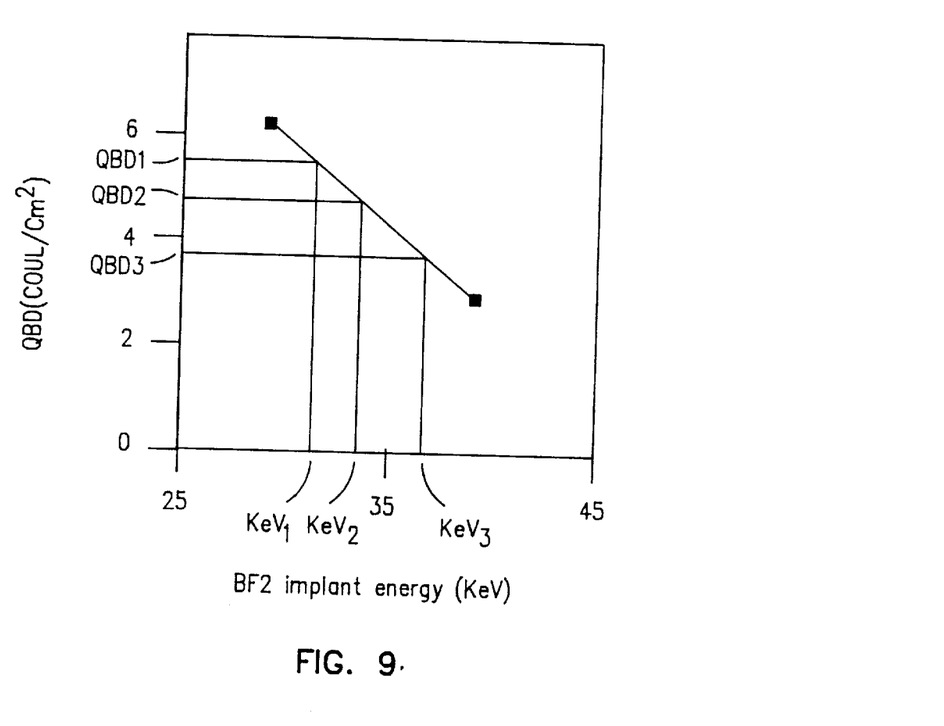
FIG. 9 is a graphical representation of the $Q_{BD}$ values related to different values of ion implant energy.

As indicated above in the discussion relating to FIG. 2, it was indicated that boron penetration is dependent upon the B or $BF_2$ implant energy level and the RTA (Rapid Temperature Anneal) temperature. Therefore, the boron penetration problem could be minimized by reducing the $BF_2$ implant energy or by reducing the RTA temperature. However, as indicated in FIG. 2, these modifications may result in an increase in the poly depletion effect. FIGS. 4 and 5 demonstrate the poly-depletion effect in strong inversion due to the lowering of RTA temperature (FIG. 4) or the reducing of the implant energy (FIG. 5). In FIG. 4, when the RTA temperature is at 1000° or 1025° C., the boron concentration at the p+-polysilicon /gate oxide interface becomes high so that the poly depletion effect disappears and the gate capacitance corresponds to the concentration of a 70 Å oxide. On the other hand, as shown in FIG. 5, increasing the $BF_2$ implant energy from 30 to 40 KeV is not sufficient to completely eliminate the poly depletion effect. The increase in boron concentration at the p+-polysilicon/ gate oxide interface, either by increasing RTA temperature or implant energy, can lead to a higher degree of boron penetration into the gate oxide through the p+-polysilicon/ gate oxide interface. For example, under the experimental conditions of FIGS. 4 and 5, the amount of boron diffused deep into the gate oxide or reaching the channel region is small, as evidenced by the negligible shift in $V_{FB}$ indicated in FIGS. 4 and 5, and the negligible change in long-channel $V_T$ and linear transconductance, as indicated in FIGS. 6 and 7. No change in linear transconductance implies that the channel mobility is not degraded due to presence of boron at the gate oxide/Si-substrate interface. The negligible shift in $V_T$ suggests that the total amount of boron penetrated into the gate oxide is either small or that most of the penetrated boron lie very close to the p+-polysilicon/gate oxide interface. FIGS. 8 and 9 indicate that at the onset of boron penetration at the p+-polysilicon/gate oxide interface the gate oxide quality is considerably degraded. This is indicated by the decrease in the charge-to-breakdown value (FIG. 8) with an increase of RTA temperature and in the decrease in the charge-to-breakdown value (FIG. 9) with an increase in implant energy level.

The data developed and illustrated in FIGS. 1–9 is used to develop an accurate method to monitor the extent of boron penetration in the p+-polysilicon gate and to optimize the process parameters associated with the diffusion of boron into the p+-polysilicon gate.

Referring to FIG. 8 there are shown representations of data that need to be collected in order to develop optimized values for the pertinent process values. To obtain the data a sample of devices manufactured with a selected set of process parameters is selected and tested to derive values for different RTA temperatures. For example, in FIG. 8 a device that has been manufactured using an RTA temperature of $T_1$ is tested to obtain a value $Q_{BD1}$ which is plotted at point 58. Similarly other devices fabricated at RTA temperatures of $T_2$, $T_2$, etc. are tested and values plotted at points 60, 61.

Similarly, devices manufactured at different implant energies are tested and the derived values are plotted as in FIG. 9.

The optimum values of $Q_{BD}$ which relate to a desired reliability value is selected and the optimum RTA temperature and implant energy level are then selected.

The $Q_{BD}$ and associated reliability values are used to establish confidence levels in the probable reliability of devices manufactured by a particular process. The $Q_{BD}$ values for the process are determined by testing samples manufactured by the process. Sufficient samples are tested to establish a confidence level and the value of a standard deviation, for example. Subsequent devices manufactured by the process will have samples tested and the values of $Q_{BD}$ can be used to determine the reliability of the remaining devices. This is extremely valuable information for the end users of the devices.

The foregoing description of the preferred embodiments of the invention has been presented for purposes of illustration and description. It is not intended to be exhaustive or to limit the invention to the precise form disclosed. Obvious modifications or variations are possible in light of the above teachings. The embodiment was chosen and described to provide the best illustration of the principles of the invention and its practical application to thereby enable one of ordinary skill in the art to utilize the invention in various embodiments and with various modifications are suited to the particular use contemplated. All such modifications and variations are within the scope of the invention as determined by the appended claims when interpreted in accordance with the breadth to which they are fairly, legally, and equitably entitled.

What we claim is:

1. A method to monitor and optimize process parameters in the fabrication of a semiconductor device having a polysilicon gate, comprising the steps of forming a gate oxide layer on a silicon substrate having a selected conductivity;

implanting a selected type of dopant ions into said gate at a first selected energy level;

driving said dopant ions into said gate towards said interface at a first selected temperature and for a first selected time interval;

measuring the charge-to-breakdown value of said semiconductor device;

repeating the step of implanting at a series of different selected energy levels into different gate electrodes which are part of different semiconductor devices for each implant; and measuring the charge-to-breakdown values of each resulting semiconductor device made from each of said series of different selected implant energy levels.

2. The method of claim 1, further comprising the steps of:

repeating the step of driving at a series of different selected temperatures and for a series of selected time intervals; and measuring the charge-to-breakdown values of each resulting semiconductor device made from each of said series of different selected temperatures and for a series of selected time intervals.

3. The method of claim 2, further comprising the steps of:

graphically and quantitatively comparing said measurements of charge-to-breakdown values; and selecting an optimum value for each of said selected implant energy, said selected temperature and said selected time interval.

4. The method of claim 3, further comprising the step of graphically and quantitatively relating a charge-to-breakdown value of said semiconductor device and a value for a process parameter.

5. The method of claim 1, wherein said polysilicon gate comprises a $p^+$-polysilicon gate.

6. The method of claim 1, wherein said polysilicon gate comprises an $n^+$-polysilicon gate.

* * * * *